US 6,720,781 B2

(12) United States Patent
Ott et al.

(10) Patent No.: US 6,720,781 B2
(45) Date of Patent: Apr. 13, 2004

(54) CIRCUIT BOARD TESTER PROBE SYSTEM

(75) Inventors: Bernd Ott, Gaildorf (DE); Manfred Prokopp, Wertheim-Reicholzheim (DE)

(73) Assignee: atg test systems GmbH & Co. KG, Wertheim (DE)

( * ) Notice: Subject to any disclaimer, the term of this patent is extended or adjusted under 35 U.S.C. 154(b) by 0 days.

(21) Appl. No.: 10/125,935

(22) Filed: Apr. 19, 2002

(65) Prior Publication Data
US 2002/0118030 A1 Aug. 29, 2002

Related U.S. Application Data

(63) Continuation of application No. PCT/EP00/08670, filed on Sep. 5, 2000.

(30) Foreign Application Priority Data

Oct. 26, 1999 (DE) .......................................... 199 51 501

(51) Int. Cl.[7] .............................................. G01R 31/02
(52) U.S. Cl. ....................... 324/754; 324/761; 324/158.1
(58) Field of Search ................................. 324/754, 761, 324/756, 158.1

(56) References Cited

U.S. PATENT DOCUMENTS

| | | | |
|---|---|---|---|
| 4,633,176 A | | 12/1986 | Reimer |
| 4,701,702 A | * | 10/1987 | Kruger ........................ 324/761 |
| 4,767,407 A | * | 8/1988 | Foran ..................... 604/164.06 |
| 4,896,107 A | | 1/1990 | Maelzer et al. |
| 5,004,977 A | * | 4/1991 | Kazama ...................... 324/756 |
| 5,084,673 A | * | 1/1992 | Kazama ...................... 324/761 |
| 5,731,710 A | | 3/1998 | Mizuno |

FOREIGN PATENT DOCUMENTS

| | | |
|---|---|---|
| DE | 31 08 523 A1 | 9/1982 |
| DE | G 85 15 436.7 | 8/1985 |
| DE | 34 26 295 A1 | 1/1986 |
| DE | 36 43 305 A1 | 6/1988 |
| DE | G 90 14 236.5 U1 | 2/1991 |
| DE | DD 293 434 A5 | 8/1991 |
| EP | 0149776 B2 | 7/1985 |
| WO | WO 92/17919 | 10/1992 |
| WO | WO 01/31348 A1 | 5/2001 |

OTHER PUBLICATIONS

SMD technology changes test equipment, *Feinwerktechnik & Messtechnik*, (Precision Mechanics & Metrology) 98, No. 7/8, pp. 317–318 (1990).

* cited by examiner

*Primary Examiner*—John B. Vigushin
*Assistant Examiner*—Tung X. Nguyen
(74) *Attorney, Agent, or Firm*—Houston Eliseeva LLP

(57) ABSTRACT

A probe for a circuit board tester as well as to an adapter and a circuit board tester. The probe comprises a needle and a sleeve, the needle being shiftingly guided in the sleeve and the needle protruding at least 10 mm from the sleeve, more particularly more than 20 mm. In one embodiment, the needle is conically tapered to a contact tip at least in a portion protruding from the sleeve. With the probe in accordance with the invention, adapters for circuit boards can be produced comprising contacts in high-density, the probes simultaneously acting resiliently.

42 Claims, 3 Drawing Sheets

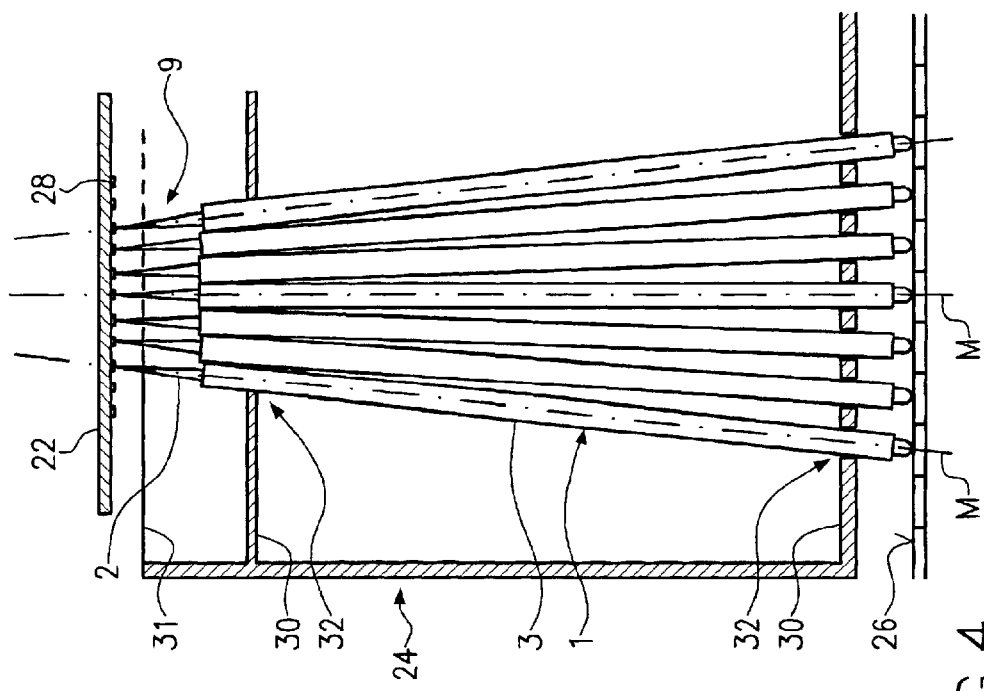
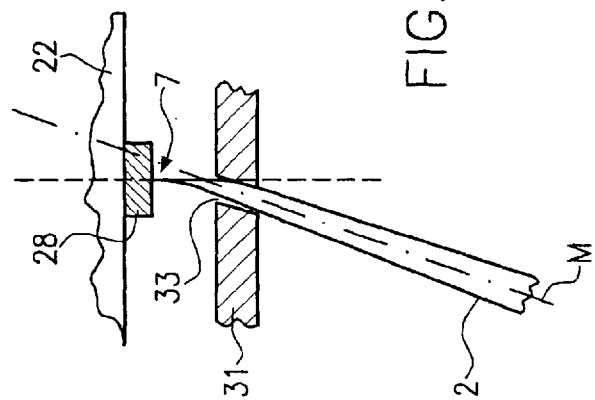

CIRCUIT BOARD TESTER PROBE SYSTEM

This is a continuation of International Application PCT/EP00/08670, filed on Sep. 5, 2000, which was published in German under PCT Article 21(2), and which claimed priority to German application No. DE 199 51 501.8 (Oct. 26, 1999), the contents of both applications being incorporated herein by this reference.

BACKGROUND OF THE INVENTION

Various kinds of pin or needle-type probes for use in circuit board testers are known from prior art. FIG. 6, for example, shows a prior art circuit board tester in which a predefined regular grid pattern of a grid pattern array G is translated with the aid of a pattern adapter R to the usually irregular arrangement of the test points T of a circuit board P to be tested. The pattern adapter R comprises as a rule several guide layers F spaced away from each other. Guide holes are incorporated into the guide layers F for receiving the probes N. The probes N are rigidly held in the adapter R and canted so that they can electrically connect the contact points of the regular grid pattern G to the circuit board test points T since these deviate from the regular arrangement of the base pattern.

To compensate irregularities in the arrangement of the circuit board test points T of the circuit board P to be tested and for an electrically reliable contact with the grid pattern array G, the pattern adapter R is in contact with a full pattern cassette V, which is equipped with resilient probes S in the corresponding pattern of the grid pattern array G. The full pattern cassette V has a full complement of probes while the pattern adapter R usually comprises only as many probes as the circuit board P comprises circuit board test points T to be tested. The styles of the probes N are usually rod-shaped and feature bosses or thickened ends as disclosed in, for example, by EP 0 149 776 B2 and DE G 90 14 236.5 U1.

Modern circuit boards comprise many internal wiring planes and/or are configured to directly receive highly integrated circuits (ICs). More particularly by making use of high-density terminal arrays, such as for example ball grid arrays (BGA), the requirements on the number of contact points to be contacted and sensed on a circuit board have substantially increased. At the same time the spacing between the contacts on such circuit boards has been reduced to approx. 0.25 millimeters (mm) (10 mil). For adapters in this field of application, extremely thin probes are used, having, for example, a diameter of only 0.1 mm to 0.2 mm. These probes are, therefore, extremely unstable. Many guide layers are usually required in the adapter to reliably guide them. Due to the requirements, the manufacturing of testers that are tailored to each style of circuit board to be tested has become very complicated.

Disclosed in the article "SMD technology changes test equipment" in "Feinwerktechnik & Messtechnik" (Precision Mechanics & Metrology)98, No. 7/8, pages 317–318 is a contact probe for SMD-populated circuit boards, which has a probe sleeve and a plunger capable of sliding in the probe sleeve. The diameter of the plunger is 1.3 mm. The article describes probes with probe sleeves having a low wall thicknesses and with plungers of smaller shank diameter as disadvantageous.

U.S. Pat. No. 4,896,107 shows contact probes with conically tapering tips. In the shank area, these contact probes have a maximum thickness of 1.3–1.4 mm, while the head formed on the contact probe has a diameter of 2 mm.

DE 36 43 305 A1 shows a spring contact probe with an elongated metal cylinder serving as a sleeve, and a one-piece metal tube-screw-spring component, which is inserted in the sleeve to form a contact probe capable of sliding in the sleeve.

Another contact probe is disclosed by DE 34 26 295 A1. This contact probe in turn has a sleeve and a plunger. The plunger is provided with a flattened section against which a crimped slot of the sleeve engages. The provision of such a contour shows that the plunger used here is relatively thick.

U.S. Pat. No. 4,633,176 relates to an adapter for the testing of circuit boards provided with test probes capable of swiveling outwards. The latter are swiveled out and aligned with predetermined contact points on the circuit board to be tested by means of a conical tip and holes acting in conjunction with the conical tip.

SUMMARY OF THE INVENTION

In accordance with the invention, a circuit board tester probe comprises a needle and a sleeve, the needle being shiftingly guided in the sleeve and the needle protruding at least 10 mm from the sleeve, and preferably more than 20 mm. The needle tapers gradually and conically to a contact tip at the area projecting from the sleeve.

This projecting, gradually and conically tapering area of the contact tip permits very dense positioning of the contact probes in the area of their contact tips, since in this area the contact probe has a very small thickness because of the conically tapering tip.

Due to the needle being guided in the sleeve, an improved inherent stiffness of the probe is achieved with resilient compensation thereof at the same time. In addition, a probe in accordance with the invention is easy to integrate in adapters for strobing high-density contact arrays having little spacing between the contact surfaces.

This combination of a needle gradually tapering to a contact tip and a sleeve from which a considerable portion of the needle projects, thus permits a dense array of several test probes in the area of their contact tips. It also has the necessary rigidity and is simple in design.

Furthermore, an adapter in accordance with the invention comprises at least two layers in parallel in which resilient probes of the aforementioned kind are mounted in through-holes. The probes are arranged partly canting and with protruding contact tips for contacting a test object. The probes on a side of the adapter opposite the test object are configured for contacting a grid pattern array with a regular arrangement of contacts.

The adapter in accordance with the invention thus eliminates a split arrangement into a full pattern cassette with resilient probes and a rigid needle adapter for adapting a regular pattern as usual with grid pattern arrays to an optional pattern of a test object. In this case, the sleeve handles the substantially supporting and guiding functions so that the number of inner layers can be minimized. In adapters, the hole pattern of each layer needs to be computed by the computer and machined with a drilled hole pattern by high-precision CNC machine tools so that each layer saved makes for considerable cost savings while significantly reducing inventory requirements.

Furthermore, a circuit board tester in accordance with the invention is characterized by a configuration including a regular grid pattern array. An adapter includes several probes, the adapter comprising at a first upper side contacts in electrical contact with the probes, which are adapted to a contact arrangement on the test array, and the contact tips of the probes protruding from a second upper side, whereby each of the contact tips is assigned to a specific circuit board test point of a test object and is in electrical contact with the circuit board test point of a test object inserted in the tester. This tester is configured of the components in accordance with the invention as described above and provides all of the cited advantages as a closed system.

The above and other features of the invention including various novel details of construction and combinations of parts, and other advantages, will now be more particularly described with reference to the accompanying drawings and pointed out in the claims. It will be understood that the particular method and device embodying the invention are shown by way of illustration and not as a limitation of the invention. The principles and features of this invention may be employed in various and numerous embodiments without departing from the scope of the invention.

BRIEF DESCRIPTION OF THE DRAWINGS

In the accompanying drawings, reference characters refer to the same parts throughout the different views. The drawings are not necessarily to scale; emphasis has instead been placed upon illustrating the principles of the invention. Of the drawings:

FIG. 4 is a side view cross-sectional view of a tester with the test object inserted;

FIG. 5 is a more detailed schematic cross-sectional view taken from FIG. 4; and

DETAILED DESCRIPTION OF THE PREFERRED EMBODIMENTS

Figure 1:
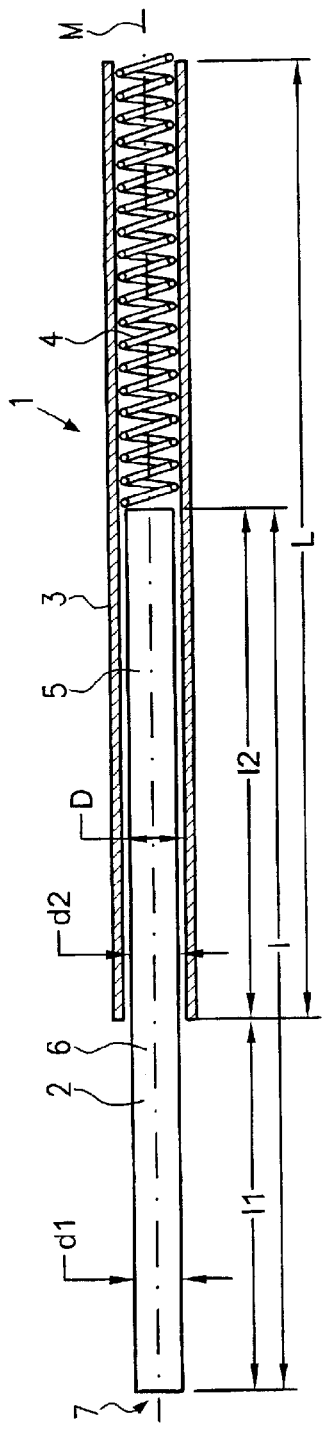
FIG. 1 is a schematic cross-sectional view of a probe according to a first embodiment of the present invention.

FIG. 1 shows a probe 1, comprising a needle 2 and a sleeve 3 with a spring 4, which has been constructed according to the principles of the present invention.

The needle 2 has an overall length l of approximately 40 mm to 70 mm; the sleeve has a length L of approximately 70 mm to 100 mm.

The needle 2 is shiftingly mounted by a guide portion 5 in the sleeve 3; the needle can thus move in the direction of a longitudinal centerline M. It is biased by the spring 4, which is installed within the sleeve 3. Thus, the needle 2 resists depression into the sleeve 3. The free end of needle 2 protrudes from the sleeve 3 by an outer portion 6 adjoining the guide portion 5. The outer portion 6 has at the one free end a contact tip 7.

An outer diameter d1 of the needle 2 in both the outer portion 6 and in the guide portion 5 as the outer diameter d2 is in the approximate range 0.15 to 0.30 mm and is preferably in the range of 0.2 to 0.25 mm. The outer diameter d2 of the base portion 6 is adapted to the inner diameter D of the sleeve 3 to ensure low-friction shifting or axial movement of the needle 2 in the sleeve 3 while enhancing the stiffness of the needle 2 by being guided through the sleeve 3.

The probe's configuration makes it possible to use thin needles 2. This enables the aforementioned probe 1 to be arranged in an adapter on a very tight center-spacing since the outer portion 6 adjoining the contact tip 7 is very thin and comprises a length of at least 10 mm. Furthermore, the needle 2 is resiliently arranged in the described probe 1 so that height variations on a test object are automatically compensated by the axial movement of the needle 2 in the sleeve 3. This thus combines the functions of the known rigid needles (dense arrangement) and the known probes (resilient) in the probe in accordance with the invention.

Figure 2:
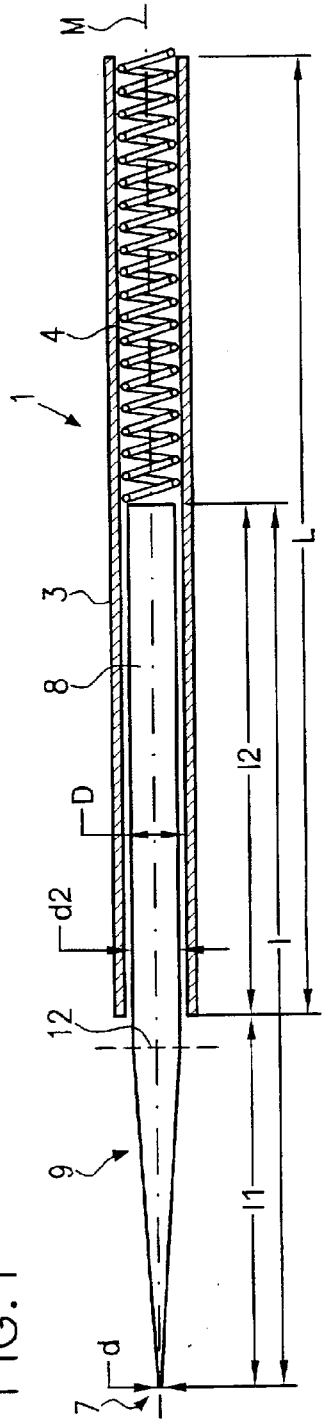
FIG. 2 is a schematic cross-sectional view of a further embodiment of the inventive probe.

FIG. 2 shows another embodiment of a probe 1 in accordance with the invention. As before, it comprises a needle, a sleeve 3, and spring 4. The needle comprises a base portion 8 and an adjoining contact portion 9. The base portion 8 forms a rod or cylindrical shaped section of circular cross-section and constant diameter d2. The contact portion 9 has a conical taper to its free end so that it comprises at its free end a contact tip 7. The diameter d of the contact tip 7 is smaller than or equal to 0.2 mm and is preferably 0.1 mm. or less, so that circuit board test points with a tight center-spacing can be contacted. The end section 12 of the base portion 8 opposite the contact tip 7 has the same diameter d2 as that of the base portion 8, whereby the end section 12 is preferably located outside of the sleeve 3.

Figure 3:
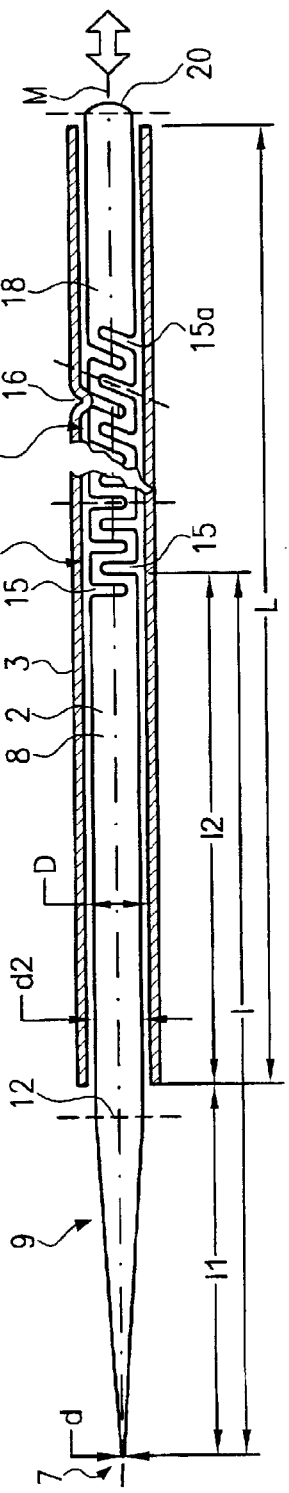
FIG. 3 is a schematic cross-sectional view of still a further embodiment of an inventive probe.
Figure 6:
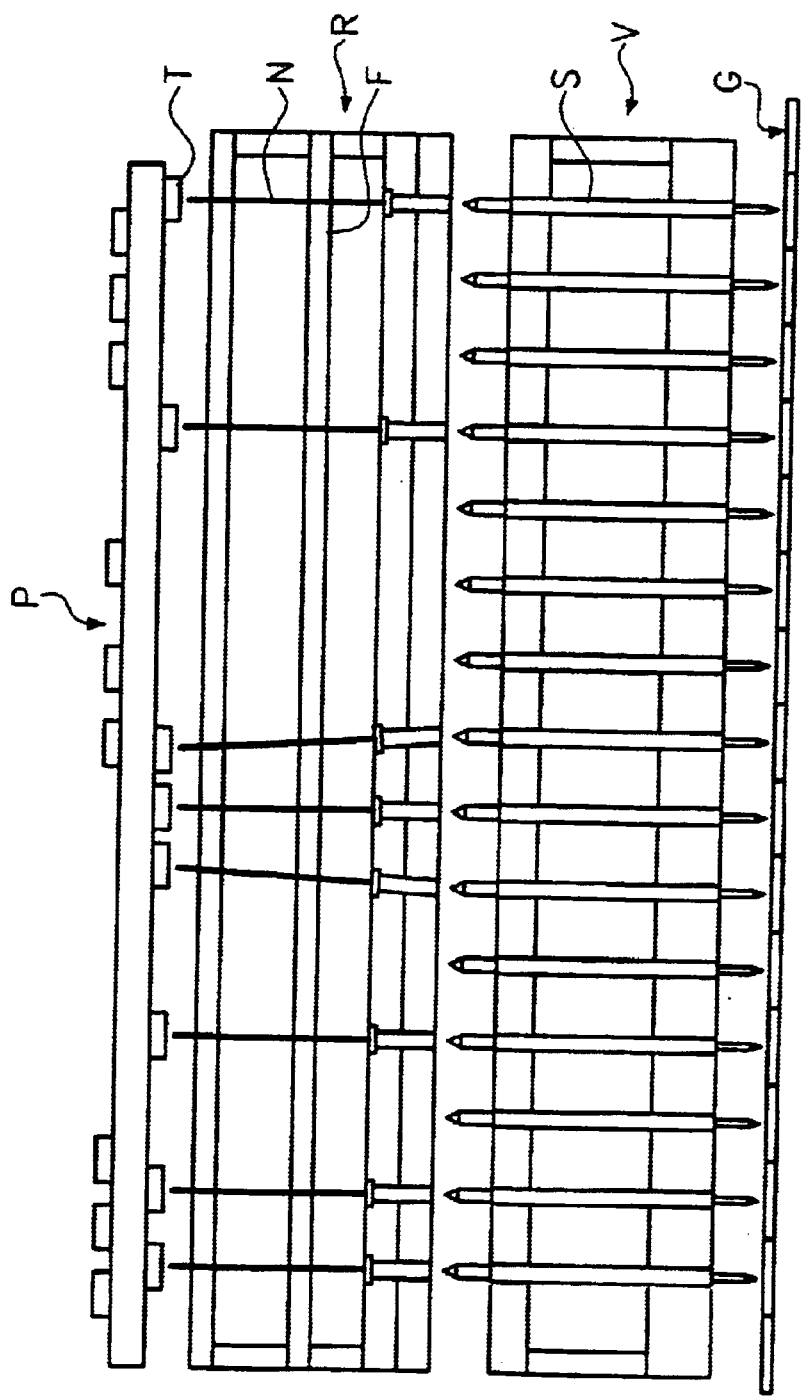
FIG. 6 is a side view of a prior art tester.

FIG. 3 shows another second embodiment of the invention. An end section 14 of the base portion 8 of the needle 2 is configured as a spring 4 by fabricating a serpentine section through the creation of incisions 15 by laser machining, for example. These laser incisions 15 are oriented perpendicular to the longitudinal centerline M and in a plane as shown in FIG. 3, in one implementation. By alternating the arrangement of the laser incisions 15 to create a meander or serpentine-type structure, a predefined spring stiffness is created. For example, increasing the length of the meander-type structure increases the resilient travel. The spring stiffness is also determined by the material properties and material strength of the webs remaining between the laser incisions 15. To enhance the spring properties the laser incisions 15a are arranged at an angle <90° to the longitudinal centerline M in another implementation, as shown.

In a further embodiment the spring is laser machined by turning the needle 2 about the longitudinal centerline M while moving the needle axially to produce a helical spring that is integral with needle 2 with variable pitch and material strength. In addition to the laser process, other comparable methods of producing the needle 2 and the spring 4 are used in other embodiments, such as etching.

As compared to fabricating a spring 4 separately, integral embodiments of the needle 2 and spring 4 offer several advantages. For one thing, the needle 2 may be fabricated by laser machining so that the needle 2 is produced or annealed in a single step in production and the spring 4 fabricated directly thereafter without requiring retooling or a change in tooling with the resulting downtime. The integral arrangement simplifies handling, while avoids the need for additional materials, time, and further tools. In addition, the integral configuration of needle 2 and spring 4 yields an ideal electrical contact between the needle 2 and spring 4. Contact boundary areas between needle 2 and the separate spring 4 with their contact resistances are avoided in this embodiment.

The needle 2 is securable either by itself or in integral connection with the needle 2 together in the sleeve 3. For this purpose the spring 4 is fixed in place preferably at an end of the sleeve 3 facing away from the contact tip 7 by soldering, welding, crimping, for example, in the sleeve 3.

FIG. 3 shows one preferred embodiment in which the spring 4 is fixed in place through an indentation 16 in an end portion in the sleeve 3 such that it is prevented from being shifted out of place or falling out. In this arrangement the fixture is arranged preferably somewhat remote from the end of the sleeve 3 so that a spring section remains at one end. Configured at this end section is an end portion 18 with a contact body 20 having a defined spring rate and more particularly configured with a barreled outer surface. This contact body 20 ensures a good electrical contact with a contact of a grid pattern array even when the probe 1 is canted, as depicted in the following description, due to this barreled outer surface.

FIG. 4 shows a circuit board 22 to be tested. The board 22 does not have any electrical components, such as integrated circuits on it, i.e., non-componented. The probes 1 are arranged in an adapter 24 with which a regular base pattern of a tester or a base pattern array 26 is translated to the irregular arrangement of the circuit board test points 28 by the probes 1 being partly canted in the adapter 24. More particularly, such an adapter 24 makes it possible to test many circuit board test points 28 located on a tight center-spacing by a corresponding number of probes 1 covering a major portion of the base pattern array 26 being directed to this portion of circuit board test points 28 on a tight contact-spacing. These probes 1 are thus focused like a beam of light to the circuit board test points 28 on a tight pitch.

The probes 1 are held in the adapter 24 by two layers 30 arranged spaced away from each other and a layer 31 located adjoining the circuit board 22 in which guide-holes 32 are incorporated and through which the probes 1 extend. The guide-holes 32 are fabricated by drilling, laser machining, or etching. The longitudinal centerlines of the guide-holes 32 in layers 30, 31 in many cases on not vertically aligned over each other relative to a plane of the corresponding layers 30, 31 (FIG. 5).

Since the needles 2 of the probes 1 protrude somewhat from the sleeve, the holes 33 in the layer 31 adjoining the test object are penetrated only by thin needles 2 and not by the sleeves 3, this being the reason why the needles 2 can be arranged densely located in the region of the layer 31.

It is to be noted in particular that the minimum spacing between the probes 1 adjoining the contact tips 7 cannot be reduced arbitrarily since there are limits to drilling the guide holes too close to each other. For example, ridges materialize in hole drilling which set minimum limits on the spacing. Due to the spatial arrangement of the probes, it is not possible to provide relatively thick probes having merely a small short tip since these needles cannot be arranged on a tight pitch due to the corresponding large drilled holes and there is also the risk of them coming into contact with the portions adjoining the contact tips. With the needles in accordance with the invention, these problems are avoided by the long length l of the free contact portion 9, which is gradually conically tapered over a predefined length l.

These restrictions need to be taken into further account when defining the dimensions of the probes 1 in accordance with the invention. These restrictions are, however, substantially less than in known testers making use of probes in accordance with prior art. Although the base pattern array 26 of the tester considerably influences the spatial arrangement of the probes 1 and, since there are limits to canting and turning the probes 1 in the adapter, and the minimum spacing of the test tips, since the probes would otherwise come into contact with each other. In an adapter 24 in accordance with the invention as shown in the magnified detail of FIG. 5, a certain reduced stiffness or flexing of the contact tip 7 of the canted needle 2 can now be utilized to deflect each of the contact tips 7 from its longitudinal centerline M by reversible or elastic bending through the guide-holes 33 located adjoining the test object. This now enables contact tips 7 of circuit board test points located even closer together to be reliable contacted without being electrically short-circuited. This is not possible in prior art. More particularly the contact tips 7 stand substantially perpendicular to the circuit board test points 28 to be contacted in each case so that electrical connections are produced more reliable by the arrangement as described.

It is particularly to be noted that producing the layers 30, 31 in an adapter 24 represents a salient cost factor as regards the costs of producing a complete tester since the drill pattern of each layer 30, 31 of the adapter 24 needs to be computed separately in a computer and drilled by CNC-controlled precision machine tools with an individual hole pattern 32. In an adapter 24 in accordance with the invention fewer layers 30, 31 are needed due to making use of the probe 1 in accordance with the invention as described above with sleeve 3, because of the increased inherent stiffness of the probes 1 in accordance with the invention as compared to known probes.

More particularly the adapter 24 in accordance with the invention may replace both a full pattern cassette having resilient probes and a rigid needle adapter for adapting a regular pattern as usual for grid pattern arrays to an optional pattern of a test object, thus saving a complete component—full pattern cassette or pattern adapter—in a tester.

While this invention has been particularly shown and described with references to preferred embodiments thereof, it will be understood by those skilled in the art that various changes in form and details may be made therein without departing from the scope of the invention encompassed by the appended claims.

What is claimed is:

1. A probe for a circuit board tester comprising
   a needle with an outer wall;
   a sleeve with a sleeve inner wall surrounding at least a portion of the outer wall of the needle to guide the needle; and
   a spring being provided in said sleeve which counteracts movement of said needle;
   wherein said needle protrudes more than 10 millimeters (mm) from said sleeve, has a maximum diameter (d2) of less than 0.30 mm, and tapers to a contact tip from the sleeve; and
   wherein the probe is installed in a circuit board tester comprising:
      a regular grid pattern array; and
      an adapter including at least two layers in parallel with each other, a first side contact of the probe being in electrical contact with and adapted to a contact arrangement on said grid pattern array, wherein said contact tip of said probe protrudes from a second side, whereby the contact tip is assigned to a specific circuit board test point of a test object and is in electrical contact with said circuit board test point of a test object inserted in said tester.

2. The probe as set forth in claim 1, wherein said needle protrudes more than 20 mm from said sleeve.

3. The probe as set forth in claim 1, wherein said needle is conically tapered to the contact tip from the sleeve.

4. The probe as set forth in claim 1, wherein said maximum diameter d2 is greater than 0.15 mm.

5. The probe as set forth in claim 1, wherein said sleeve is tubular and has an inner diameter (D) that is adapted to a constant outer diameter (d1,d2) of said needle and said needle is conically tapered from a transition of a base portion into a contact portion up to said contact tip.

6. The probe as set forth in claim 5, wherein said base portion has a length (11) of at least 30 mm.

7. The probe as set forth in claim 6, wherein said contact tip has a diameter (d) of less than 0.2 mm and an end portion of said contact portion opposite said contact tip comprises a diameter (d2) that is larger by at least 0.1 mm than said contact tip.

8. The probe as set forth in claim 7, wherein said base portion has a length (11) of at least 30 mm.

9. The probe as set forth claim 8, wherein said spring is formed from an end opposite said contact tip of a guide portion of said needle located in said sleeve.

10. The probe as set forth claim 9, wherein said spring is fabricated by laser machining.

11. The probe as set forth in claim 10, wherein said spring is formed from part of said guide portion of said needle by fabricating incisions.

12. The probe as claimed in claim 11, wherein said spring is connected to said guide portion of said needle opposite said contact tip by laser welding.

13. The probe as set forth in claim 11, wherein said needle is fixed in place in said sleeve by crimping the sleeve.

14. The probe as set forth in claim 11, wherein said needle is fixed in place in said sleeve by folding the sleeve.

15. The probe as set forth in claim 11, wherein said needle is fixed in place in said sleeve by soldering the sleeve.

16. The probe as set forth in claim 1, wherein said contact tip has a diameter (d) of less than 0.2 mm and an end portion of a contact portion opposite said contact tip comprises a diameter (d2) that is larger by at least 0.1 mm than said contact tip.

17. The probe as set forth in claim 1, wherein said spring is formed from an end opposite said contact tip of a guide portion of said needle located in said sleeve.

18. The probe as set forth in claim 1, wherein said spring is fabricated by laser machining.

19. The probe as set forth in claim 1, wherein said spring is formed from part of a guide portion of said needle by fabricating incisions.

20. The probe as claimed in claim 1, wherein said spring is connected to a guide portion of said needle opposite said contact tip by laser welding.

21. The probe as set forth in claim 1, wherein said needle is fixed in place in said sleeve by crimping die sleeve.

22. The probe as set forth in claim 1, wherein said needle is fixed in place in said sleeve by folding the sleeve.

23. The probe as set forth in claim 1, wherein said needle is fixed in place in said sleeve by soldering the sleeve.

24. An adapter comprising:
at least two layers in parallel with each other;
probes, each comprising a needle with an outer wall, a sleeve with a sleeve inner wall surrounding at least a portion of the outer wall of the needle to guide the needle; and a spring being provided in said sleeve that counteracts movement of said needle, wherein said needle protrudes more than 10 millimeters (mm) from said sleeve, has a maximum diameter (d2) of less than 0.30 mm, and tapers to a contact tip from the sleeve, wherein the probes are mounted in through-holes in said layers, said probes being arranged partly canting relative to said layers and having protruding contact tips for contacting a test object, an end of said probes opposite said contact tips being adapted to contact a grid pattern array with a regular arrangement of contacts that the probes engage.

25. The adapter as set forth in claim 24, wherein said contact tips are spaced from each other by less than 0.3 mm.

26. The tester as set forth in claim 24, wherein said contact tips are spaced from each other by approximately 0.25 mm.

27. The tester as set forth in claim 24, wherein said contact tips have diameters of approximately 0.1 mm.

28. The tester as set forth in claim 24, wherein at least one probe in said adapter in the region of said contact tip is deflected by at least one of the layers.

29. A circuit board tester comprising:
a regular grid pattern array; and
an adapter including several probes having contact tips, at least two layers in parallel with each other, first side contacts in electrical contact with said probes, which are adapted to a contact arrangement on said grid pattern array, wherein said contact tips of said probes protrude from a second side, whereby each of said contact tips is assigned to a specific circuit board test point of a test object and is in electrical contact with said circuit board test point of a test object inserted in said tester.

30. The tester as set forth in claim 29, wherein said contact tips at said second side of said adapter have a spacing of less than 0.3 mm.

31. The tester as set forth in claim 29, wherein said contact tips at said second side of said adapter have a spacing of approximately 0.25 mm.

32. The tester as set forth in claim 29, wherein said contact tips have diameters of approximately 0.1 mm.

33. The tester as set forth in claim 29, wherein at least one probe in said adapter in the region of said contact tip is deflected by at least one of the layers.

34. A probe for a circuit board tester comprising
a needle;
a sleeve surrounding at least a portion of the needle to guide the needle; and
a spring being provided in said sleeve which counteracts movement of said needle;
wherein said needle at least sometimes protrudes more than 10 millimeters from said sleeve, has a maximum diameter of less than 0.30 millimeters, and tapers to a contact tip;
wherein the probe is installed in a circuit board tester comprising:
a regular grid pattern array; and
an adapter including at least two layers in parallel with each other, a first side contact of the probe being in electrical contact with and adapted to a contact arrangement on said grid pattern array, wherein said contact tip of said probe protrudes from a second side, whereby the contact tip is assigned to a specific Circuit board test point of a test object and is in electrical contact with said circuit board test point of a test object inserted in said tester.

35. The probe as set forth in claim 34, wherein said needle protrudes more than 20 millimeters from said sleeve.

36. The probe as set forth in claim 34, wherein said needle is conically tapered to the contact tip from the sleeve.

37. The probe as set forth in claim 34, wherein said maximum diameter is greater than 0.15 mm.

38. The probe as set forth in claim 34, wherein said sleeve is tubular and has an inner diameter that is adapted to an outer diameter of said needle and said needle is conically tapered from a transition of a base portion into a contact portion up to said contact tip.

39. The probe as set forth in claim 38, wherein said base portion has a length of at least 30 mm.

40. The probe as set forth in claim 39, wherein said contact tip has a diameter of less than 0.2 mm and an end portion of said contact portion opposite said contact tip comprises a diameter that is larger by at least 0.1 mm than said contact tip.

41. The probe as set forth in claim 1, wherein the probe is arranged partly canting relative to said layers.

42. The probe as set forth in claim 41, wherein the probe in said adapter is deflected by at least one of the layers in the region of the contact tip.

* * * * *